(12) United States Patent
Yu et al.

(10) Patent No.: US 9,349,617 B2
(45) Date of Patent: May 24, 2016

(54) MECHANISMS FOR WAFER CLEANING

(71) Applicant: TAIWAN SEMICONDUCTOR MANUFACTURING CO., LTD., Hsin-Chu (TW)

(72) Inventors: Shang-Yuan Yu, Hsinchu (TW); Shao-Yen Ku, Jhubei (TW); Chien-Wen Hsiao, Hsinchu (TW); Hong-Jie Xu, Caotun Zhen (TW); Jui-Chuan Chang, Hsinchu (TW); Wen-Chang Tsai, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/087,567

(22) Filed: Nov. 22, 2013

(65) Prior Publication Data
US 2015/0144159 A1  May 28, 2015

(51) Int. Cl.
*H01L 21/67* (2006.01)

(52) U.S. Cl.
CPC .... *H01L 21/67057* (2013.01); *H01L 21/67051* (2013.01)

(58) Field of Classification Search
None
See application file for complete search history.

(56) References Cited

U.S. PATENT DOCUMENTS

| | | | | |
|---|---|---|---|---|
| 5,975,740 A | * | 11/1999 | Lin et al. | 700/99 |
| 6,036,031 A | * | 3/2000 | Ishikawa | 211/41.18 |
| 6,235,147 B1 | * | 5/2001 | Lee | H01L 21/6708 134/1.3 |
| 7,456,113 B2 | * | 11/2008 | Rayandayan et al. | 438/745 |
| 7,730,898 B2 | * | 6/2010 | Hung et al. | 134/137 |
| 2002/0062839 A1 | * | 5/2002 | Verhaverbeke et al. | 134/1.3 |
| 2008/0035181 A1 | * | 2/2008 | Takahashi et al. | 134/61 |
| 2008/0092929 A1 | * | 4/2008 | Yokouchi | 134/30 |
| 2008/0282976 A1 | * | 11/2008 | Okada | B08B 5/00 118/696 |
| 2011/0309051 A1 | * | 12/2011 | Choi et al. | 216/83 |
| 2013/0074872 A1 | | 3/2013 | Yeh et al. | |

FOREIGN PATENT DOCUMENTS

| | | |
|---|---|---|
| JP | 05-315312 A | 11/1993 |
| KR | 10-2000-0021469 | 4/2000 |
| KR | 10-2013-0032229 | 4/2013 |

* cited by examiner

*Primary Examiner* — Nicole Blan
(74) *Attorney, Agent, or Firm* — Birch, Stewart, Kolasch & Birch, LLP

(57) ABSTRACT

Embodiments that relate to mechanisms for cleaning wafers is provided. A method for wafer cleaning includes cleaning wafers by a wet-bench cleaning operation. The method also includes thereafter cleaning each of the wafers by a single-wafer cleaning operation. In addition, a cleaning apparatus for enhancing the performance of the above method is also provided.

13 Claims, 7 Drawing Sheets

MECHANISMS FOR WAFER CLEANING

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased, scaling-down process generally provides benefits by increasing production efficiency and lowering associated costs.

A critical condition in semiconductor manufacturing is the absence of contaminants on the wafer processing surface, since contaminants including, for example, microscopic particles, may interfere with and adversely affect subsequent processing steps leading to device degradation and ultimately semiconductor wafer rejection. While the wafer cleaning process has always been a critical step in the semiconductor wafer manufacturing process, ultra-clean wafers are becoming even more critical to device integrity. For example, as semiconductor feature sizes decrease, the detrimental effect of particle contaminations increases, requiring removal of ever-smaller particles. Furthermore, as the number of device layers increase, there is a corresponding increase in the number of cleaning steps and the potential for device degradation caused by particulate contaminations. To adequately meet requirements for ultra-clean wafers in ULSI and VLSI, the wafer surface needs to be essentially free of contaminating particles.

It is desired to have methods and an apparatus for cleaning wafers to reduce contaminations on the wafers.

BRIEF DESCRIPTION OF THE DRAWINGS

For a more complete understanding of the embodiments, and the advantages thereof, reference is now made to the following descriptions taken in conjunction with the accompany drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact. Throughout the various views and illustrative embodiments, like reference numbers are used to designate like elements.

Figure 1:
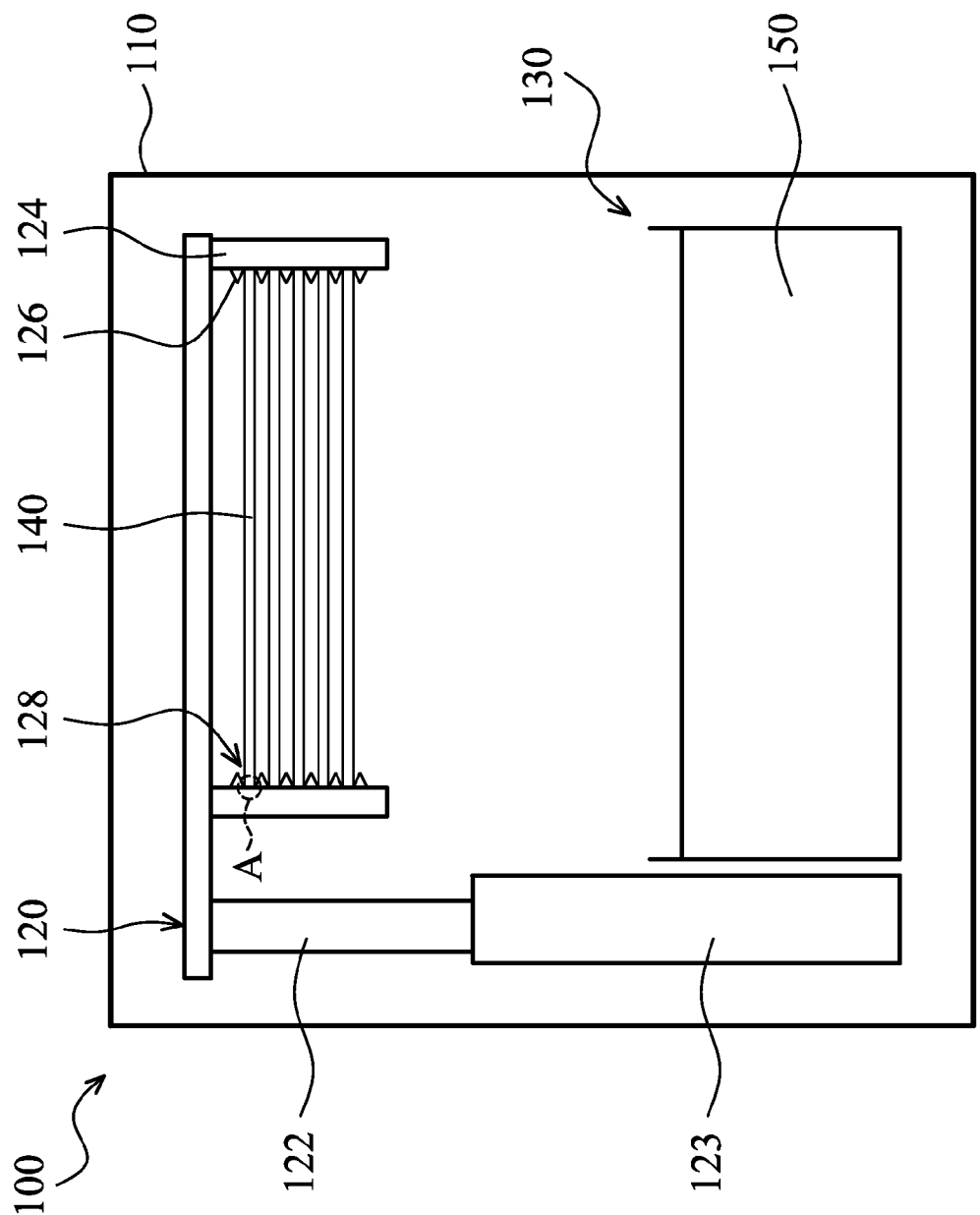
FIG. 1 shows a cross-sectional view of a wet-bench apparatus, in accordance with some embodiments.

FIG. 1 shows a cross-sectional view of a wet-bench apparatus 100, in accordance with some embodiments. The wet-bench apparatus 100 may include a chamber 110. A lifter 120 and a tank 130 may be disposed within the chamber 110. The lifter 120 is associated with the tank 130 and is movable with respect to the tank 130. The lifter 120 may include a wafer holder 122 and be connected to a lifting device 123. The lifting device 123 may allow the wafer holder 122 to be positioned above or below the level of the fluid contained in the tank 130. The wafer holder 122 may include sidewalls 124, dividers 126 on the sidewalls 124 and grooves 128 between the dividers 126. In some embodiments, the wafer holder 122 is made from quartz or a plastic having satisfactory corrosion and chemical resistance. For example, the plastic includes fluorine resin, vinyl chloride, polyethylene, polypropylene, polybutyleneterephthalate (PRT), polyetheretherketone (PEEK) or the like. The fluorine resin may include polyvinylidene difluoride (PVDF), perfluoroalkoxy (PFA), polytetrafluoroethene (Teflon®), or a combination thereof. In some embodiments, the dividers 126 may have a triangular shape, a rectangular shape, a Y-shape, a pin shape, or a combination thereof.

A batch of wafers 140 may be positioned in the wafer holder 122. The wafers 140 may include silicon. Alternatively, the wafers 140 include germanium, silicon germanium or other proper semiconductor materials. The wafers 140 may include regions where one or more semiconductor devices, or portions thereof, are formed (e.g., field effect transistors). Various isolation features may be formed in the wafers 140 interposing various doped regions (e.g., n-wells and p-wells) formed in various active regions. The wafers 140 include one or more dies formed thereon, which may subsequently be diced to form semiconductor devices. The wafers 140 may be greater than about 250 mm in diameter. In some embodiments, each of the wafers 140 is greater than about 450 mm in diameter.

A pattern of features (not shown) may be associated with a semiconductor device or portion thereof, such as gate structures (e.g., polysilicon features, metal gate features, etc), source/drain regions, interconnect lines or vias, dummy features, and/or other suitable patterns. Many ion implantation processes are performed throughout the fabrication of the above features. During this process, a photoresist is used to mask off a region to be implanted, and ions are implanted into the desired implant region. For example, the implant can be arsenic, boron, or phosphorus implants. The photoresist may be organic compounds. The photoresist needs to be removed after the desired implant region is implanted.

In some embodiments, wet etchant 150 is contained in the tank 130. In some embodiments, the adaptable wet etchant 150 includes SPM ($H_2SO_4$, $H_2O_2$), APM ($NH_4OH$, $H_2O_2$), SC1 (deionized water (DIW), $NH_4OH$, $H_2O_2$), SC2 (DIW, HCl, $H_2O_2O_2$), ozonated deionized water, $H_3PO_4$, dilute hydrofluoric acid (DHF), HF, HF/ethylene glycol (EG), $HF/HNO_3$, $NH_4OH$, a combination thereof, or the like. The wet etchant 150 reacts with the photoresist to etch it from the wafer surface.

In some embodiments, the wet-bench cleaning apparatus 100 also includes other tanks containing with one or more chemicals or a rinse solvent. For example, the wet-bench cleaning apparatus 100 may include a rinse tank (not shown) containing with the rinse solvent. The rinse solvent may include deionized water, an organic solvent, or other specific composition chemicals.

A wet-bench cleaning operation may effectively remove the photoresist from the wafers 140. In some embodiments, the wet-bench cleaning operation uses the wet-bench cleaning apparatus 100 as shown in FIG. 1. The wet-bench cleaning operation may include an immersion process and a rinse process which may be repeated until the photoresist and other contaminations on the wafers 140 are cleaned. The immersion process may include immersing the wafers 140 into the wet etchant 150 for a requisite amount of time dictated by process requirements. The rinse process may include immersing the wafers 140 into the rinse solvent for cleaning out the etch-generated particles and removing the wet etchant 150.

Particle residuals are oftentimes remaining in the contact positions A of the lifter 120 and the wafers 140. The wet etchant 150 and the rinse solvent may not flow freely through the contact positions A because the hindrance of the lifter 120, for example, covered by the sidewalls 124 and dividers 126. Therefore, another design of the lifter is provided for enhancing the cleaning performance on the contact positions A of the wafer 140 with the lifter 120.

Figure 2:
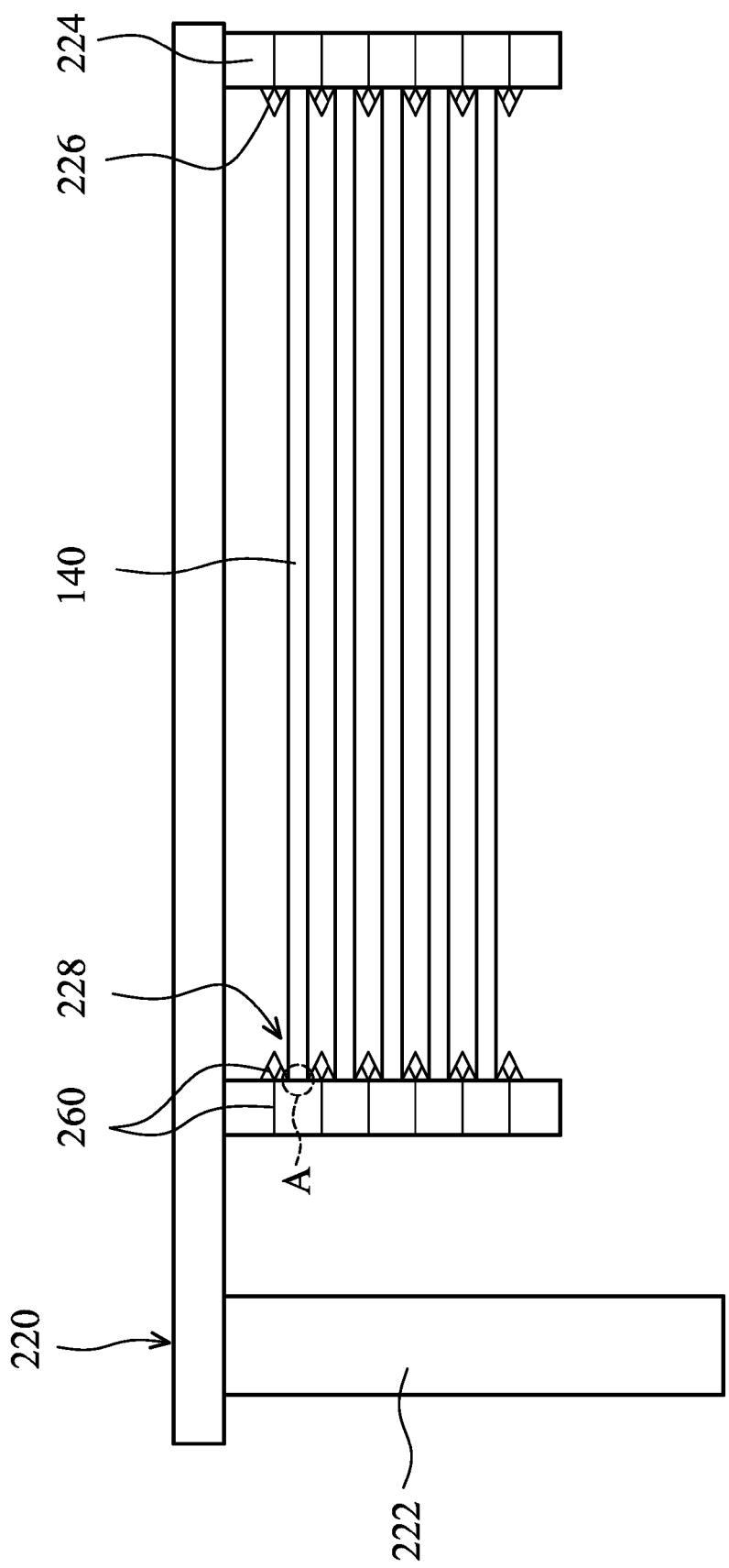
FIG. 2 shows a cross-sectional view of a lifter which carries a batch of wafers, in accordance with some embodiments.

FIG. 2 shows an enlarged view of a lifter 220 which carries a batch of wafers 140, in accordance with some embodiments. The lifter 220 may include a wafer holder 222. The wafer holder 222 may include sidewalls 224, dividers 226 on the sidewalls and grooves 228 between the dividers 226. The wafers 140 are inserted horizontally into the grooves 228 and supported by the dividers 226. In some embodiments, pipes 260 are formed in the wafer holder 222. For example, the pipes 260 are formed in the sidewalls 224 and dividers 226. The pipes 260 may be through holes and have openings adjacent to the grooves 228 (i.e., adjacent to the contact positions A) to direct the wet etchant 150 and/or the rinse solvent to positions adjacent to the contact positions A. Therefore, the wet etchant 150 and the rinse solvent may have an increased flow rate to flow through the positions adjacent to the contact positions A while the wafer holder 222 moves downward to immerse into the wet etchant 150 or the rinse solvent. The pipes 260 may help reduce the chances of contamination on the contact positions A. In some embodiments, the pipes 260 include a Y-shape, an X-shape, a rod shape, a pin shape, or the like.

The lifter 220 with the pipes 260 can improve the particle residuals adjacent to the contact positions A. However, the inherent cross-contamination between wafers 140 and flow-pattern defect associated with natural liquid dynamics are still a problem needing to be overcome.

Figure 3:
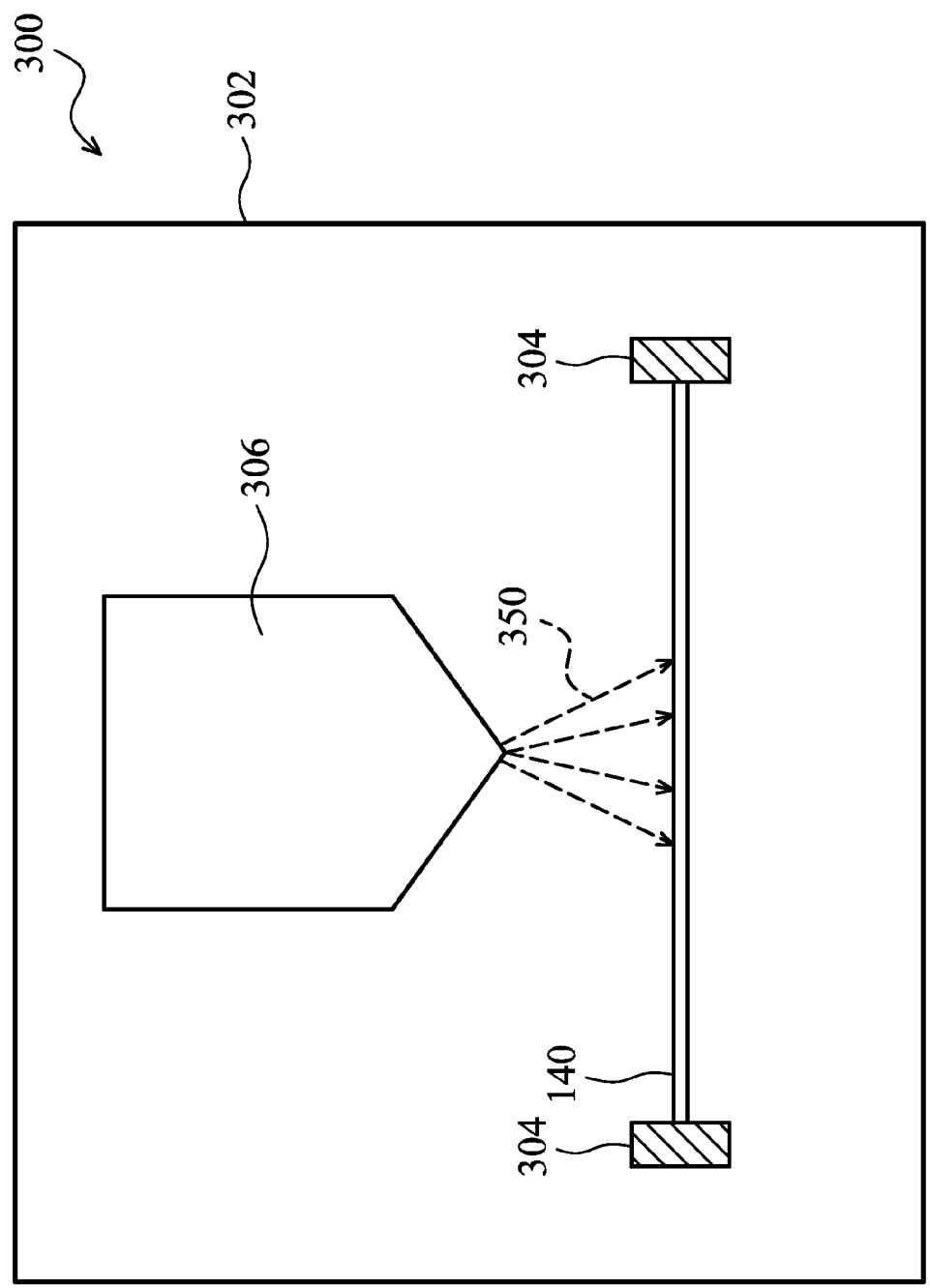
FIG. 3 shows an exemplary diagram of a single-wafer cleaning apparatus, in accordance with some embodiments.

Therefore, an alternate approach, such as a single-wafer cleaning operation, is provided. The single-wafer cleaning operation involves processing one wafer in a (non-immersion) single-wafer apparatus at a time. FIG. 3 shows an exemplary diagram of a single-wafer cleaning apparatus 300, in accordance with some embodiments. The single-wafer cleaning apparatus 300 may include a chamber 302, a wafer-positioning element 304 and a dispenser 306. A cleaning fluid 350 may be sprayed from the dispenser 306 to a front side of the wafer 140. In some embodiments, the cleaning fluid 350 includes SPM ($H_2SO_4$, $H_2O_2$), APM ($NH_4OH$, $H_2O_2$), deionized water (DIW) (including hot DIW), SC1 (deionized water (DIW), $NH_4OH$, $H_2O_2$), SC2 (DIW, HCl, $H_2O_2$), ozonated deionized water, $H_3PO_4$, dilute hydrofluoric acid (DHF), HF, HF/ethylene glycol (EG), $HF/HNO_3$, $NH_4OH$, a combination thereof, or the like. The cleaning fluid 350 may be in a temperature ranging from about 0 degrees Celsius to about 250 degrees Celsius. The dispenser 306 may include one or more nozzles, one or more spray bars, and/or other configuration for introducing the cleaning fluid 350 to the front side of the wafer 140.

The wafer-positioning element 304 includes configurations that position and/or move the wafer 140 under the dispenser 306. For example, the wafer-positioning element 304 includes chuck pins. The wafer-positioning element 304 may contact the side portions of the wafer 140. The wafer-positioning element 304 is operable to hold a single wafer. In some embodiments, the wafer-positioning element 304 rotates the wafer 140 about its radial axis. Example wafer rotation speeds are in a range from about 10 rpm to about 2500 rpm.

During the single-wafer cleaning operation, one of the wafers 140 is disposed on the wafer-positioning element 304. The cleaning fluid 350 is dispensed on the front side of the wafer 140 while the wafer 140 is rotating. The cleaning fluid 350 on the wafer 140 may spread outward and flow through entire areas of the front side of wafer 140. The waste fluid, such as excess or contaminated cleaning fluid, is drained out. Compared to the wet-bench cleaning operation, the single-wafer cleaning operation can provide improved clean efficiency and process stability.

The issues with the single-wafer cleaning operation are thermal stress, the charge effect, and edge-temperature difference. The reaction of the cleaning fluid (such as the SPM) 350 and the photoresist may produce heat and result in thermal stress. The thermal stress can cause the pattern of features to collapse or peel from the wafers 140, especially if the photoresist is highly implanted. The static charges may be generated and accumulated at the center of the wafer 140 due to the friction of the cleaning fluid 350 and photoresist that is rotated with the wafer 140. In some embodiments, the accumulated charges induce center arcing. In addition, the center of the wafer 140 often has a temperature higher than the edge because the cleaning fluid 350 is sprayed towards the center of the wafer 140. The lower temperature at the edge of the wafer 140 may induce particle residuals to still remain on the edge of the wafer 140.

Figure 4:
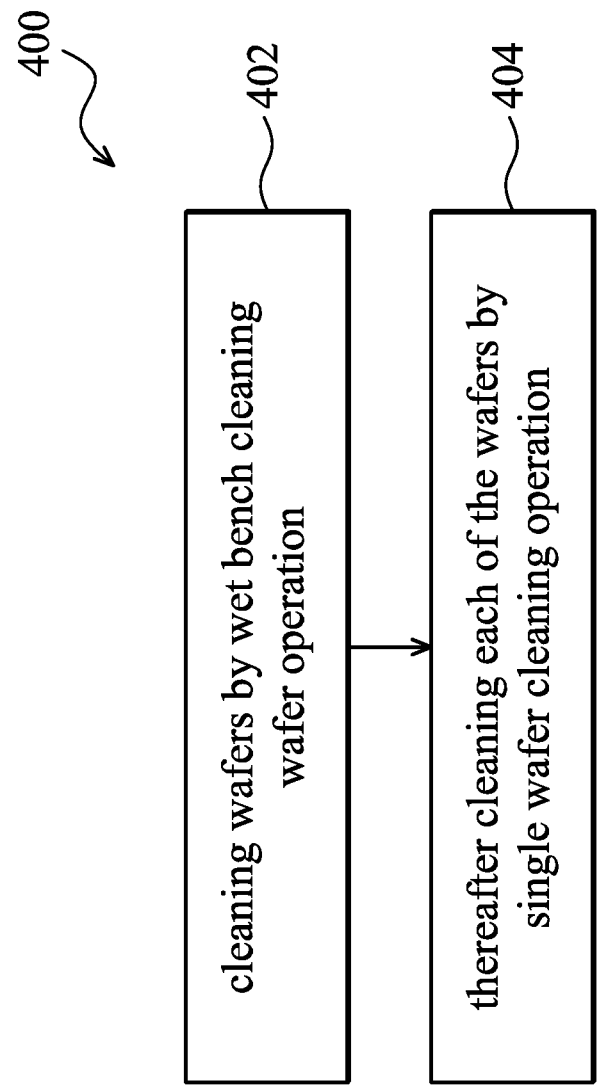
FIG. 4 shows a method for cleaning wafers in a flowchart, in accordance with some embodiments.

Therefore, mechanisms to resolve both the drawbacks of the wet-bench cleaning operation and the single-wafer cleaning operation are provided. The mechanisms relate to a continuous two-step method of the wet-bench cleaning operation and the single-wafer cleaning operation. FIG. 4 shows a method 400 for cleaning wafers in a flowchart, in accordance with some embodiments. In some embodiments, the method 400 starts with operation 402, in which wafers are cleaned by a wet-bench cleaning operation. Thereafter, the method 400 continues with operation 404, in which each of the wafers is cleaned by a single-wafer cleaning operation.

Figure 5:
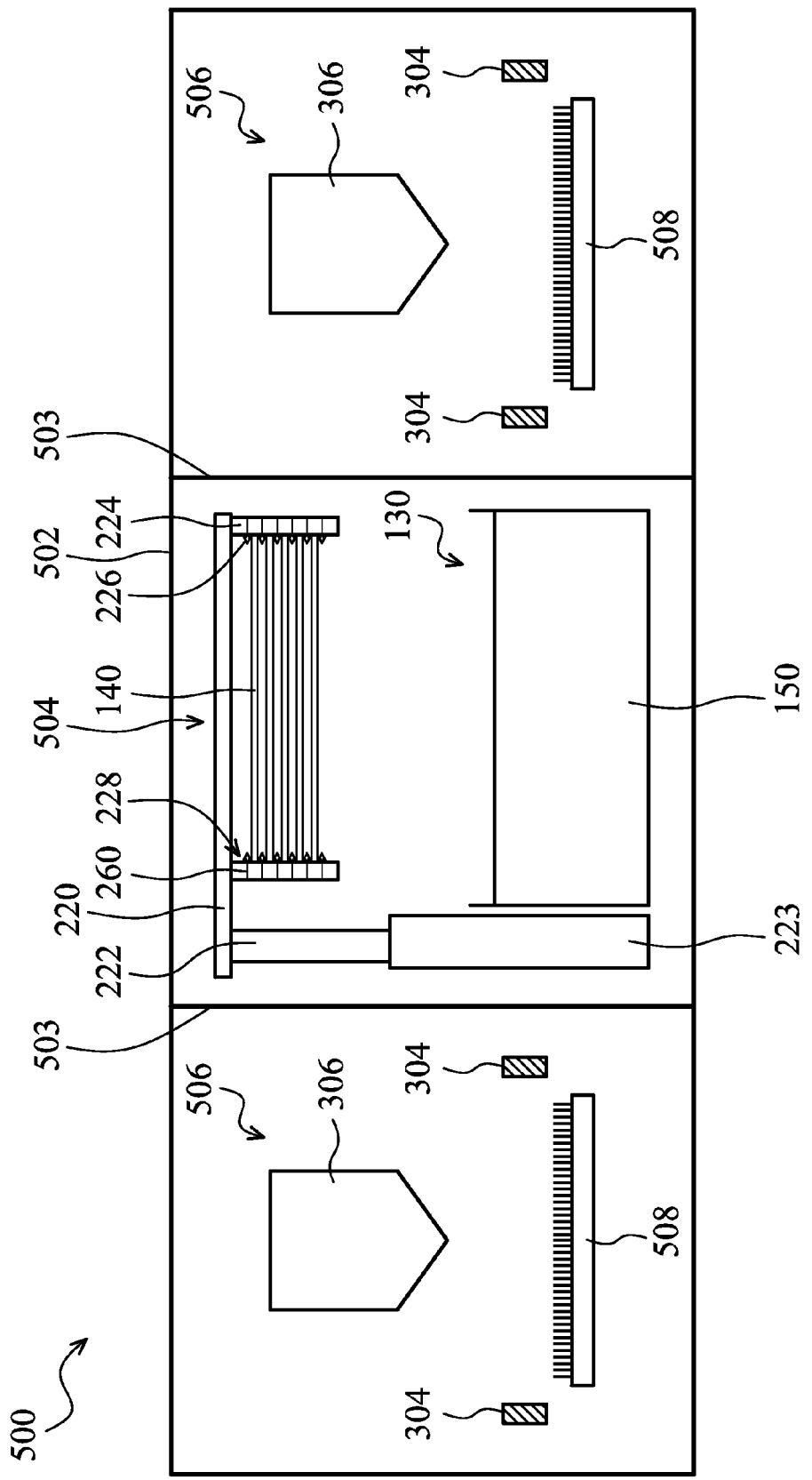
FIG. 5 shows an exemplary diagram of a clean apparatus, in accordance with some embodiments.

In some embodiments, the method 400 is operated in a clean apparatus 500 for optimization. FIG. 5 shows an exemplary diagram of a clean apparatus 500, in accordance with some embodiments. The clean apparatus 500 may include a chamber 502. A wet-bench cleaning device 504 and single-wafer cleaning devices 506 are within the chamber 502 with or without a partition 503 therebetween. The single-wafer cleaning devices 506 are adjacent to the wet-bench cleaning device 504. In some embodiments, the operation 402 is performed in the wet-bench cleaning device 504, and the operation 404 is performed in the single-wafer cleaning devices 506. The wet-bench cleaning device 504 may include the lifter 120 or 220 and the tank 130. The tank 130 may be containing with the wet etchant 150. In some embodiments, the wet-bench cleaning device 504 further includes other tanks containing with one or more chemicals and a rinse solvent (e.g., deionized water). Each of the single-wafer cleaning devices 506 may include the wafer-positioning element 304 and the dispenser 306. In some embodiments, each of the single-wafer cleaning devices 506 further includes a backside brush 508 for cleaning the backside of the wafer 140.

The number of single-wafer cleaning devices 506 may be equal to the wafer capacity of lifter 120 or 220 for better efficiency, although only two single-wafer cleaning devices 506 are shown in FIG. 5 for simplicity. Alternatively, the number of the single-wafer cleaning devices 506 may be greater or lower than the wafer capacity of lifter 120 or 220. Each of the single-wafer cleaning devices 506 may be individual to each other. For example, each of the single-wafer cleaning devices 506 can perform its operation whether other single-wafer cleaning devices 506 are performing their operations or not. The priority and delay time of transferring each of the wafers 140 from the wet-bench cleaning device 504 to the single-wafer cleaning devices 506 may be programmable and can be controlled by a computer. The single-wafer cleaning devices 506 can be arranged in the chamber 502 in any suitable manner.

Figure 6A:
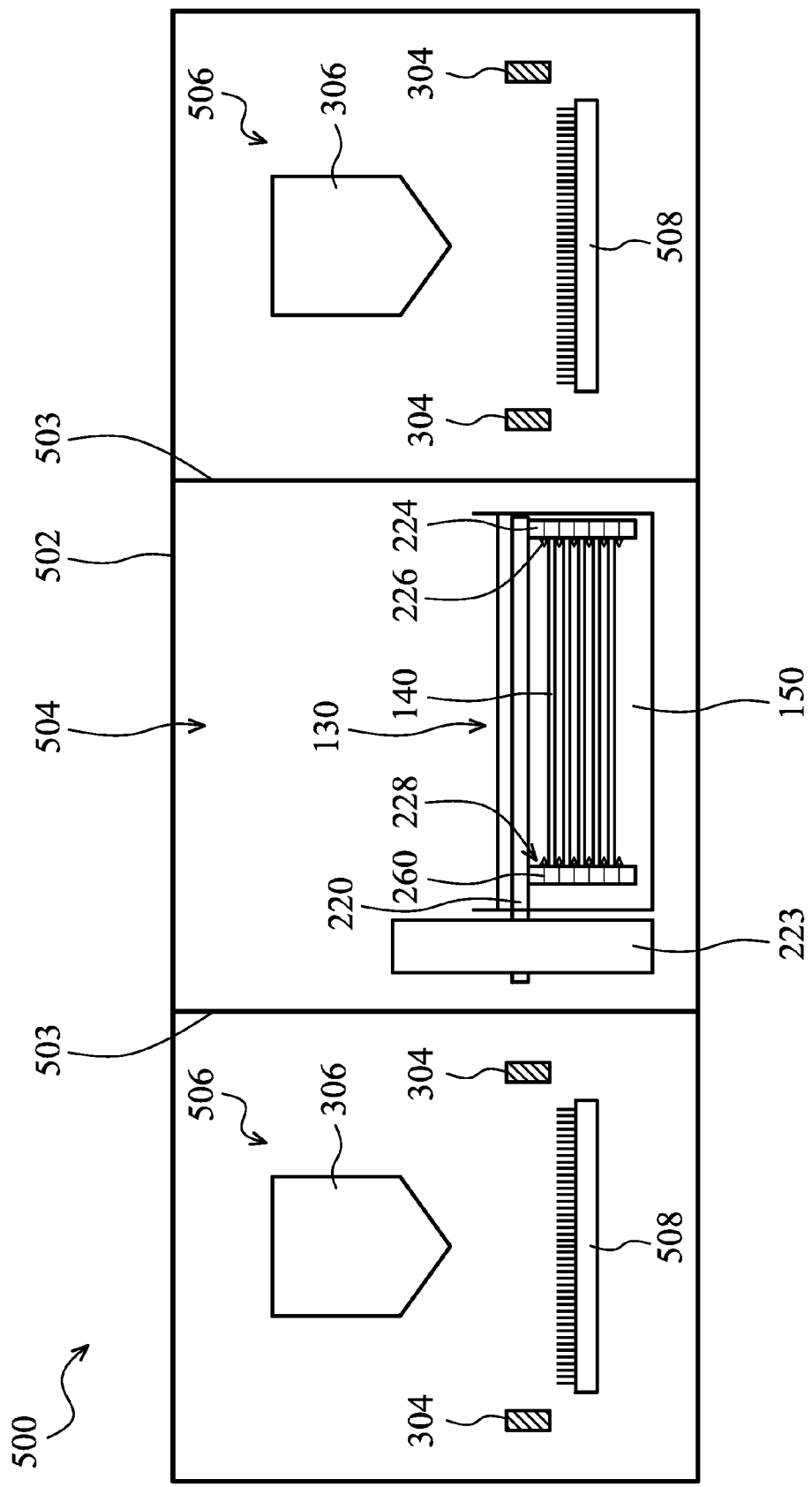
FIGS. 6A and 6B show exemplary cross-sectional views at various stages of a method for cleaning wafers, in accordance with some embodiments.
Figure 6B:
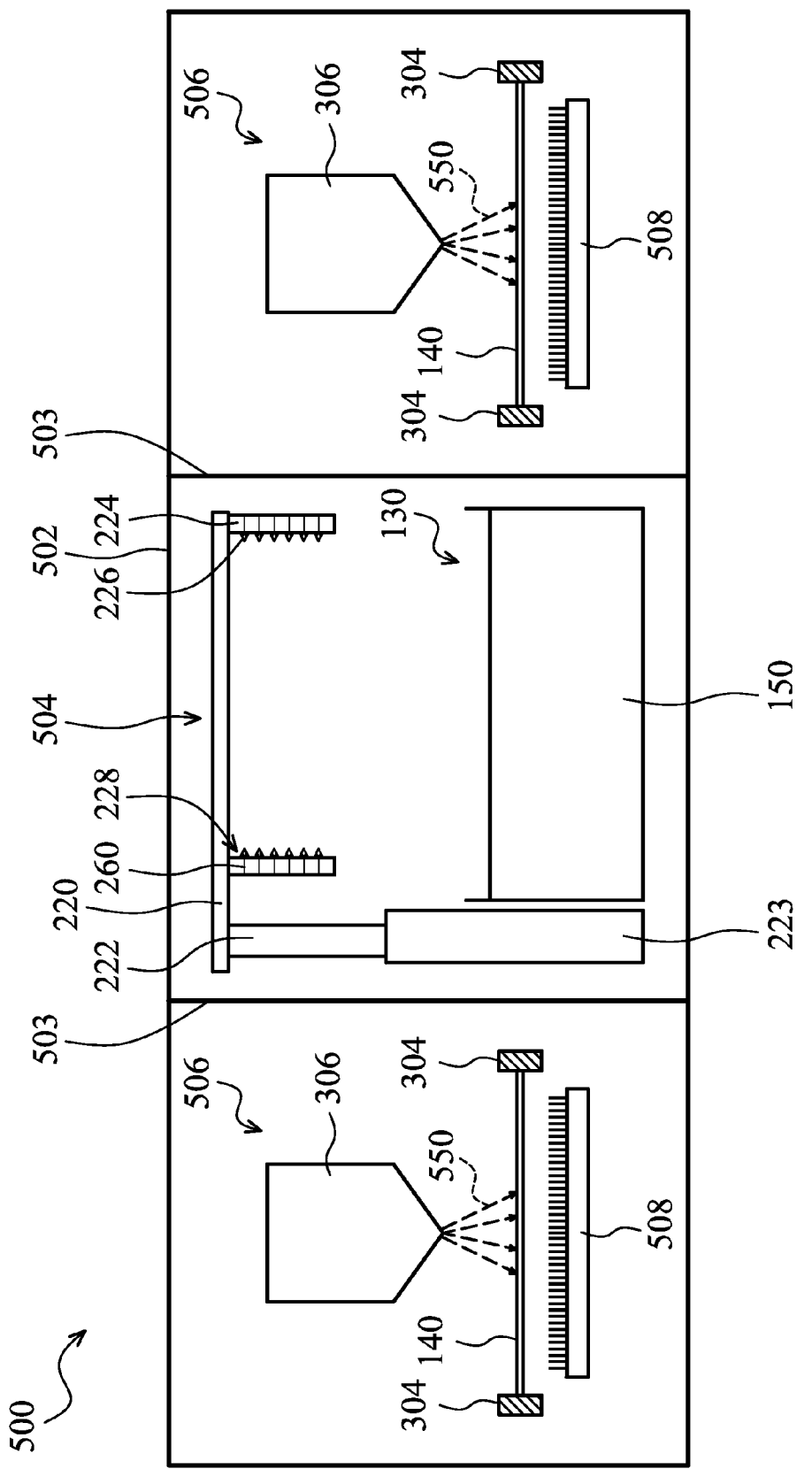

FIGS. 6A and 6B show exemplary cross-sectional views at various stages of the method 400, in accordance with some embodiments. As shown in FIG. 6A, the wet-bench cleaning operation 402 is performed in the wet-bench cleaning device 504. In some embodiments, the operation 402 may include immersing the batch of wafers 140 into the wet etchant 150 for removing most of the photoresist on the wafers 140. For example, a range of about 10% to 100% of the photoresist on each of the wafers 140 is removed in the wet-bench cleaning operation 402. The wet etchant 150 may include SPM ($H_2SO_4$, $H_2O_2$), APM ($NH_4OH$, $H_2O_2$), SC1 (deionized water (DIW), $NH_4OH$, $H_2O_2$), SC2 (DIW, HCl, $H_2O_2$), ozonated deionized water, $H_3PO_4$, dilute hydrofluoric acid (DHF), HF, HF/ethylene glycol (EG), HF/$HNO_3$, $NH_4OH$, a combination thereof, or the like. In some embodiments, the wet-bench cleaning operation 402 further includes a rinsing process after the immersion process.

Afterwards, referring to FIG. 6B, each of the wafers 140 is transferred to respective single-wafer cleaning device 506 and then cleaned by the single-wafer cleaning operation 404. In some embodiments, the single-wafer cleaning operation 404 includes, in each of the single-wafer cleaning devices 506, dispensing a cleaning fluid 550 on the wafer 140 for further cleaning the wafers 140 that have been cleaned by the wet-bench cleaning operation 402. The cleaning fluid 550 may include deionized water (DIW), SPM ($H_2SO_4$, $H_2O_2$), APM ($NH_4OH$, $H_2O_2$), SC1 (deionized water (DIW), $NH_4OH$, $H_2O_2$), SC2 (DIW, HCl, $H_2O_2$), ozonated deionized water, HF/$HNO_3$, $NH_4OH$, a combination thereof, or the like. In some embodiments, the cleaning fluid 550 doesn't need the SPM, APM, SC1, SC2, ozonated deionized water, HF/$HNO_3$, $NH_4OH$, or a combination thereof when most of the photoresist has been removed in the wet-bench cleaning operation 402. In other words, in some embodiments, the cleaning fluid includes only the deionized water. It is more cost effective than the individual single-wafer cleaning operation. The wet-bench cleaning operation 402 and the single-wafer cleaning operation 404 may be continuously performed in the same apparatus 500 and are not transferred out of the chamber 502. The wet-bench cleaning device 504 and the single-wafer cleaning device 506 are integrated into the same chamber 502, saving time and reducing the risk of transferring the wafers 140 to different apparatuses.

The continuous two-step method 400 may provide better cleaning performance than the individual operations of wet-bench cleaning and single-wafer cleaning. The particle residuals on the wafers 140 that have not been cleaned by the wet-bench cleaning operation 402 can be further cleaned by the single-wafer cleaning operation 404. In addition, the issues with the individual single-wafer cleaning operation, namely the thermal stress, charge effect and edge temperature difference, may also be improved. Most of the photoresist are removed in the wet-bench cleaning operation 402, and therefore the heat and static charges would not be excessively produced in the single-wafer cleaning operation 404. Accordingly, the continuous two-step method 400 combines the advantages of the wet-bench cleaning operation 402 and the single-wafer cleaning operation 404 while eliminating their drawbacks.

It will be appreciated that some embodiments relate to mechanisms for wafer cleaning are provided. For example, a method including a continuous two-step method of a wet-bench cleaning operation and a single-wafer cleaning operation is provided, combining their individual advantages while reducing their drawbacks. Furthermore, a cleaning apparatus suitable for enhancing the performance of the method described above is also provided.

In accordance with some embodiments, a method for wafer cleaning is provided. The method includes cleaning wafers by a wet-bench cleaning operation. The method also includes thereafter cleaning each of the wafers by a single-wafer cleaning operation.

In accordance with some embodiments, an apparatus for wafer cleaning is provided. The apparatus includes a chamber. The apparatus also includes a wet-bench cleaning device within the chamber, and the wet-bench cleaning device comprises a lifter associated with a tank. The apparatus further includes a plurality of single-wafer cleaning devices within the chamber and adjacent to the wet-bench cleaning device. Each of the single-wafer cleaning devices includes a dispenser over a wafer-positioning element In accordance with some embodiments, a method for wafer cleaning is provided. The method includes performing wet-bench cleaning operation on a batch of wafers. The wet-bench cleaning operation includes immersing the wafers into a tank containing with a wet etchant, and the wet etchant is able to react with a material on the wafer and producing heat. The method also includes transferring each of the wafers to respective single-wafer cleaning device. The method further includes performing single-wafer cleaning operation on the wafer in each single-wafer cleaning device. The single-wafer cleaning operation includes dispensing a cleaning fluid on the wafer, and the cleaning fluid is deionized water, SPM ($H_2SO_4$, $H_2O_2$), APM ($NH_4OH$, $H_2O_2$), SC1 (deionized water (DIW), $NH_4OH$, $H_2O_2$), SC2 (DIW, HCl, $H_2O_2$), ozonated deionized water, $H_3PO_4$, dilute hydrofluoric acid (DHF), HF, HF/ethylene glycol (EG), HF/$HNO_3$, $NH_4OH$, a combination thereof.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus for wafer cleaning, comprising:
   a chamber;
   a wet-bench cleaning device within the chamber, wherein the wet-bench cleaning device comprises a lifter associated with a tank;
   a plurality of single-wafer cleaning devices within the chamber and adjacent to the wet-bench cleaning device, wherein the wet-bench cleaning device is between the single-wafer cleaning devices, and each of the single-wafer cleaning devices comprises a dispenser over a wafer-positioning element; and
   a controller, configured and programmed to control priority and delay time of transferring wafers to be cleaned between the wet-bench cleaning device and the plurality of single-wafer cleaning devices,
   wherein the lifter comprises a wafer holder configured to hold wafers in a horizontal direction, the wafer holder including two vertical sidewalls, each of the two vertical sidewalls having a plurality of dividers and a plurality of grooves thereon, each of the grooves being located between two immediately adjacent dividers, and
   wherein the wafer holder further includes a plurality of pipe, each of the pipes extending through a corresponding one of the two vertical sidewalls and splitting into two paths in a corresponding one of the dividers, the two paths respectively extending through the corresponding one of the dividers at two different surfaces of the corresponding one of the dividers, the two different surfaces of the corresponding one of the divider being respectively located at two different grooves.

2. The apparatus as claimed in claim 1, wherein the number of single-wafer cleaning devices is equal to the wafer capacity of the lifter.

3. The apparatus as claimed in claim 1, wherein each of the single-wafer cleaning devices further comprises a backside brush for cleaning a backside of the wafer. through holes and have openings adjacent to the grooves.

4. The apparatus as claimed in claim 1, wherein the wafer holder is connected to a lifting device, such that the wafer holder is positioned in the tank.

5. The apparatus as claimed in claim 1, wherein the wafer holder comprises quartz or plastic.

6. The apparatus as claimed in claim 1, further comprising a partition within the chamber and between the wet-bench cleaning device and at least one of the plurality of single-wafer cleaning devices.

7. The apparatus as claimed in claim 1, further comprising a wet etchant in the tank.

8. The apparatus as claimed in claim 7, wherein the wet etchant comprises SPM ($H_2SO_4$, $H_2O_2$), APM ($NH_4OH$, $H_2O_2$), SC1 (deionized water (DIW), $NH_4OH$, $H_2O_2$), SC2 (DIW, HCl, $H_2O_2$), ozonated deionized water, $H_3PO_4$, dilute hydrofluoric acid (DHF), HF, HF/ethylene glycol (EG), HF/$HNO_3$, $NH_4OH$ or a combination thereof.

9. The apparatus as claimed in claim 8, wherein the wet-bench cleaning device further comprises other tanks with one or more chemicals and a rinse solvent.

10. The apparatus as claimed in claim 1, wherein the dispenser contains a cleaning fluid therein.

11. The apparatus as claimed in claim 10, wherein the cleaning fluid is deionized water, SPM ($H_2SO_4$, $H_2O_2$), APM ($NH_4OH$, $H_2O_2$), SC1 (deionized water (DIW), $NH_4OH$, $H_2O_2$), SC2 (DIW, HCl, $H_2O_2$), ozonated deionized water, $H_3PO_4$, dilute hydrofluoric acid (DHF), HF, HF/ethylene glycol (EG), HF/$HNO_3$, $NH_4OH$, a combination thereof.

12. The apparatus as claimed in claim 10, wherein the cleaning fluid is in a temperature ranging from about 0 degrees Celsius to about 250 degrees Celsius.

13. The apparatus as claimed in claim 1, wherein the wafer-positioning element comprises chuck pins.

* * * * *